United States Patent
Hamblin et al.

[11] Patent Number: 5,414,715
[45] Date of Patent: May 9, 1995

[54] METHOD FOR AUTOMATIC OPEN-CIRCUIT DETECTION

[75] Inventors: Michael W. Hamblin, Stow; Gordon D. Robinson, Acton, both of Mass.

[73] Assignee: GenRad, Inc., Concord, Mass.

[21] Appl. No.: 14,154

[22] Filed: Feb. 5, 1993

[51] Int. Cl.⁶ .............................................. G06F 11/00
[52] U.S. Cl. .................................. 371/23; 371/22.1; 371/22.6; 371/27
[58] Field of Search ............ 371/23, 22.1, 22.6, 371/27; 324/158.1

[56] References Cited

U.S. PATENT DOCUMENTS 4,937,826  6/1990  Gheewala et al. ............... 371/22.1
5,058,112  10/1991 Namitz et al. ...................... 371/23
5,321,701  6/1994  Raymond et al. ................ 371/22.1

OTHER PUBLICATIONS

GenRad, Inc., "GR228X Test Set Preparation Manual", Instruction Manual, Version 1.6, Nov. 27, 1992.

*Soviet Inventions Illustrated,* E1 section, week 8730, Sep. 9, 1987, Derwent Publications Ltd., London.
*Soviet Inventions Illustrated,* E1 section, week C 34, Oct. 1, 1980, Derwent Publications Ltd., London.

Primary Examiner—Emanuel T. Voeltz
Assistant Examiner—Hal D. Wachsman
Attorney, Agent, or Firm—Cesari and McKenna

[57] ABSTRACT

When an automatic circuit tester (10) detects that a fault has occurred in a circuit board (14), it applies to the circuit board (14) a sequence of vectors that differs from the test sequence ($T_n$, $T_{n+1}$) by which the fault detection occurs only in that each vector's component that corresponds to an input pin in question on the board device under test maintains a level that simulates an open circuit at that input pin. If the resultant response differs from the response to the original test sequence, the input pin can often be ruled out as one at which a fault has occurred. In this way, many open-circuit faults at input pins can be diagnosed without special probing, even when several such faults occur simultaneously.

9 Claims, 6 Drawing Sheets

METHOD FOR AUTOMATIC OPEN-CIRCUIT DETECTION

BACKGROUND OF THE INVENTION

The present invention is directed to diagnosing faults on printed-circuit boards that result from open circuits in the connections to the input pins of devices mounted on such boards.

Many assembled printed-circuit boards embody enormously complex electronic circuitry. A board can thus have any one of a very large number of different types of possible faults, for which the assembled printed-circuit board must be tested. From the standpoint of circuit operation, the largest part of the complexity, of course, results from the internal organizations of the various devices mounted on the board, many of which incorporate thousands of transistors apiece. Despite these devices' internal complexity, however, the overwhelming majority of the faults encountered in the testing of complex printed-circuit boards result not from the internal operations of the devices themselves but rather from improper device mounting, and many of the device-mounting problems result from bad solder connections or other sources of open circuits.

To test it for these and other faults, a circuit board is typically placed on a "bed of nails" array of probes, which simultaneously contact various nodes on the board. By means of these probes, sequences of test vectors, i.e., of sets of node signals, are applied at some nodes, the resultant response is sensed at other nodes, and the board is declared faulty if the sensed signals differ from the nominal response that a good board would produce.

Once the tester has determined that the board is faulty, it is often desirable for it also to be able to diagnose the fault, i.e., to determine not only that a fault exists but also what that fault is. While almost all types of faults can readily be detected by such automatic circuit testing, many types of faults tend to evade diagnosis: the tester can detect the fault affect but cannot identify the fault that caused it. Some simple open circuits are among faults of that type. Most open circuits in the connections of device output pins can readily be detected: stimuli are applied that cause the signal at the output pin in question to change, and the resultant signals are observed on a node to which that output pin should be connected. If no change occurs, of course, then the fault has been diagnosed. Because of certain complicating factors, diagnoses of this type may not be possible in every case, but most open circuits on output nodes can be diagnosed automatically simply by bed-of-nails probing.

The same could not heretofore have been said of open circuits between device input pins and nodes to which board conductive paths should connect them. Of course, the open circuit does affect the operation of the improperly mounted device. But the relationship between a given input and the device's outputs is quite complex in most reasonably sophisticated devices, and this makes it difficult to determine, from a given symptom in the output, whether it is caused by an input-pin open circuit or, if so, which input pin is the one that is improperly connected.

One way of dealing with this problem is simply to apply signals to input nodes—i.e., to nodes to which a device's input pin should be in electrical communication—and then, by means of a hand probe, to contact a device input pin and determine whether the signal on the pin is the same as that applied to the associated input node. But the manual operation that this approach requires increases labor costs and greatly slows the testing process. For boards that employ so-called surface-mount technology, moreover, the difficulty of obtaining access to the input pin may preclude its use entirely.

Another approach is the fault-dictionary approach. In this approach, the faulty response is observed and compared with a "dictionary" of faulty responses, including the responses that result from open circuits at input nodes. But generating such a fault dictionary requires sophisticated fault simulation, and, although software for such simulation is available, the board manufacturer may not consider it worthwhile to invest the considerable effort required to use it to develop the fault dictionary. As a practical matter, moreover, the fault-dictionary approach lends itself only to diagnosis of faults that occur alone; it is not practical to generate and store dictionary entries for all fault combinations.

SUMMARY OF THE INVENTION

We have developed a method of fault diagnosis for open circuits that requires no special probing—i.e., no probing other than that routinely provided by a bed-of-nails fixture in an in-circuit test—but can diagnose many multiple faults. It achieves this in a comparatively simple fashion, i.e., without the simulation and storage burden that a fault-dictionary approach would impose.

Specifically, when a board device fails its in-circuit test—i.e., when its response to the test vector sequence differs from the nominal response expected of a good device—the tester applies a modified vector sequence that differs from the test sequence only in the component in each vector that corresponds to a given input node. That component remains at the signal level that the input pin assumes when an open circuit occurs in its connection to the board. If the given device pin is properly connected to the board, the resultant response will differ from the observed, faulty response to the original test vector sequence. If the response to the modified vector sequence is the same as the response to the test vector sequence, on the other hand, then there is an open circuit between the input node and its associated device input pin.

As will be described in more detail below, most practical implementations of this method require certain additional steps, which somewhat complicate the procedure just described. Even with such complications, however, the resultant diagnostic procedure is fairly simple compared with most, yet it diagnoses many multiple faults.

BRIEF DESCRIPTION OF THE DRAWINGS

These and further features and advantages are described below in connection with the accompanying drawings, in which.

DETAILED DESCRIPTION OF AN ILLUSTRATIVE EMBODIMENT

Figure 1:
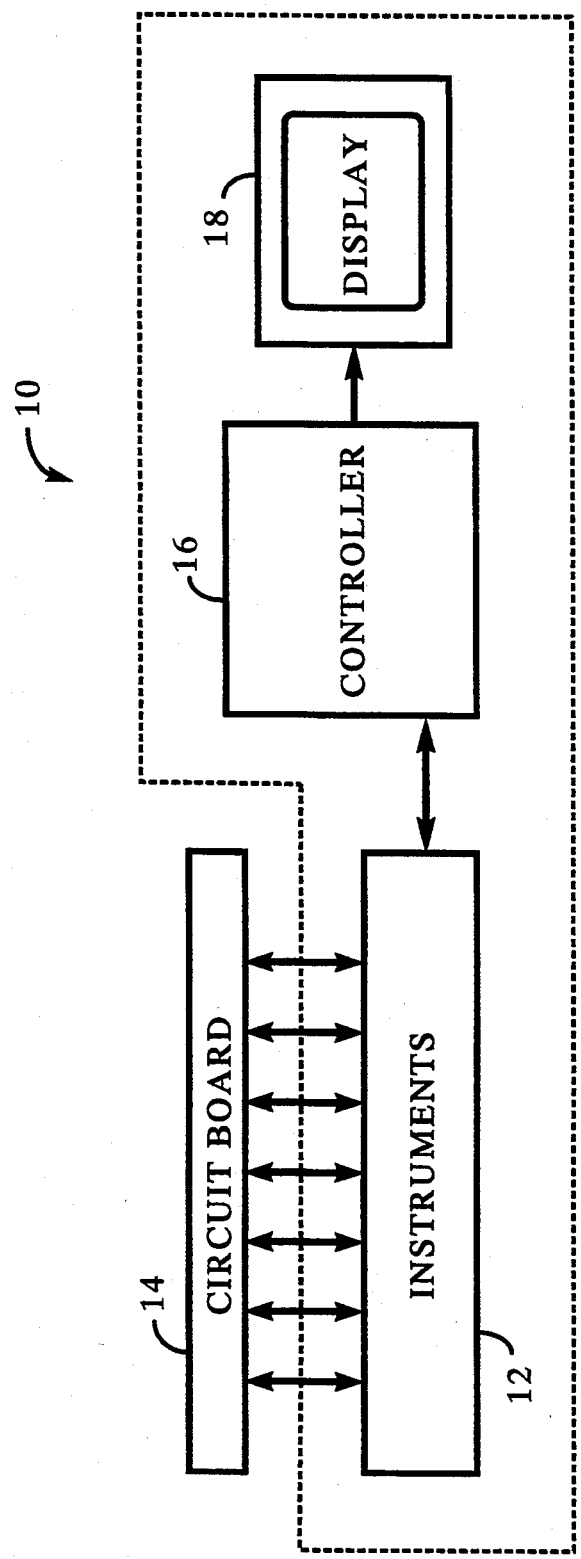
FIG. 1 is a block diagram of the test environment in which the present invention is employed.

FIG. 1 depicts, in a highly simplified form, the environment in which the present invention is practiced. An automatic circuit tester 10 employs a variety of instruments 12 that probe various points ("nodes") on a circuit board 14 so as to apply signals to some of them and sense the resultant signals at others. A controller 16, typically in the form of a small general-purpose computer with appropriate memory, delivers to the instruments 12 series of test "vectors" of signal combination that the instruments are to apply and test for in the course of an in-circuit test. The instruments 12 report the test results to the controller, which may respond by ordering various diagnostic tests. The controller 16 then generates an indication of whether the board is operating properly, as FIG. 1 suggests by depicting controller 16 as running a visual display device 18. Of course, such an indication may instead simply be written to a disk or other storage device for later review.

FIG. 2 depicts, again in a highly simplified form, the in-circuit testing of a device U1 on the circuit board 14. An in-circuit test of device U1 tests the operation of that device after it has been mounted on the board 14. (While the focus of in-circuit testing is the function of the individual board device rather than those of the board as a whole, the "device" thus tested may actually be clusters of integrated circuits in respective packages separately mounted on the board.) To perform such a test, drivers such as drivers 20, 22, 24, and 26 apply signals to respective nodes 28, 30, 32, and 34—i.e., points on the board designated for probing, typically by a bed-of-nails fixture—so as to apply stimuli to the device U1 under test. The logic values that the drivers 20, 22, 24, and 26 apply at successive clock times are specified by successive vectors $T_n$ of a test sequence received from the controller 16.

Figure 2:
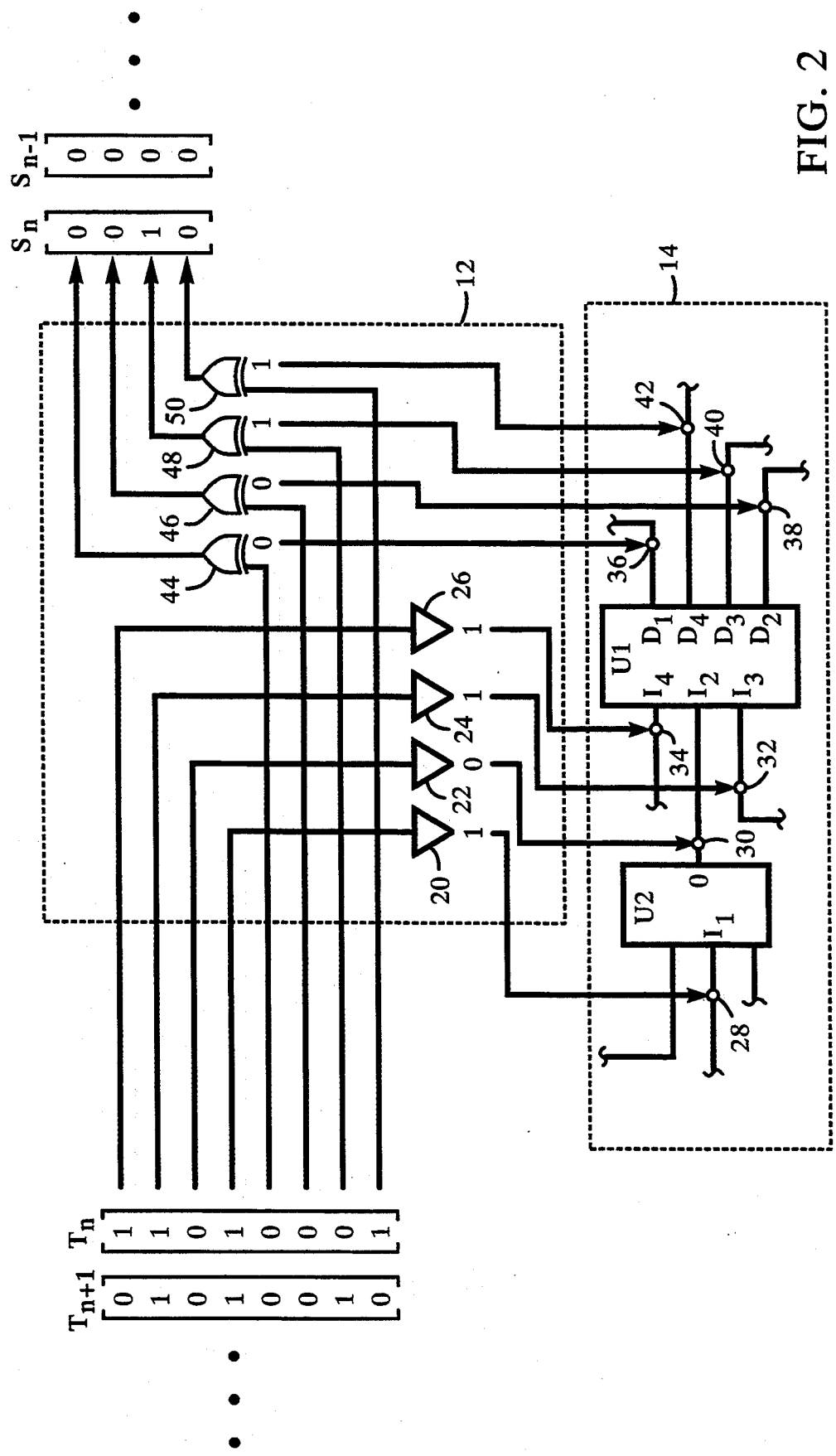
FIG. 2 is a schematic diagram that depicts the driving and sensing of a device under test.

As FIG. 2 shows, the drivers 20-26 apply inputs not only to the nodes 30, 32, and 34 that are supposed to be connected to the input pins $I_2$, $I_3$, and $I_4$ of U1 but also to a node 28 intended to be connected to an input pin $I_1$ of a neighbor device U2. (As used herein, the term input pin not only refers to pins dedicated to receiving signals but also refers to "bidirectional" pins, which sometimes act as input pins and sometimes act as output pins.) Although the subject of the in-circuit test is only U1, operation of U2, which has an output pin connected to an input pin of U1, has the potential to interfere with the signals applied, for instance, by driver 22 to node 30; the drivers 20-26 are designed to have low-frequency output impedances low enough to overcome outputs from devices like U2, but their high-frequency output impedances are not so low, and it is therefore important to prevent some neighboring devices from producing rapidly changing output signals. For this purpose, an input node 28 may be driven because it is connected to a disable pin of device U2 and will thus prevent such signals. Another reason for applying signals to U2 may be just the opposite, namely, to cause it to apply to node 30 the $I_2$ signals that the test dictates. This "virtual probe" approach, which may be used if it is impossible or inconvenient to probe node 30 physically, is most practical if U2 is a boundary scan device, and it can be used not only for applying stimuli but also for sensing the response that results.

The response of U1 to the stimuli appears at output nodes 36, 38, 40, and 42. In practice, however, the vectors $S_n$ that the instruments report to the controller 16 are not the response itself but rather the syndrome, i.e., the difference between the expected response and the actual response. The drawing depicts each vector component as consisting of only a single bit, representing the logic level to be tested for or applied, and the sensors are accordingly depicted as simple XOR gates. Those skilled in the art will recognize that this is a considerable simplification. The vector components in most testers can also take other values, such as a "don't care" value for sensors and a high-impedance ("tristate") value for drivers. Moreover, most of the instruments may actually be configured as driver-sensors, i.e., as instruments that can alternately drive and sense, so the vectors may also include an indication of which of these functions is to be performed.

The simplified representation of FIG. 2 suffices for present purposes, however, and depicts a point in a fault-detection test in which a fault effect is detected. For good devices properly mounted, all syndrome vectors S will be, like $S_{n-1}$, all zeroes, indicating no difference between the actual response and the nominal response. But if the device is not operating properly, or if it is improperly mounted or connected, one or more components of the syndrome vectors will be logic values, indicating differences between the nominal and actual responses.

To illustrate, FIG. 2 depicts sensor 48 as sensing a logic-one value at node 40 when the test component associated with that node is a logic zero. The component corresponding to node 40 in nth vector $S_n$ of the syndrome recorded for this test indicates a fault effect. Some tests are designed to store such information only for the first detected error, but we will assume that the tester completes the test for U1 and records all fault effects.

The cause of the fault effect may be an internal failure in U1, but experience indicates that most such faults result from the "board-stuffing" operation, which may introduce short circuits or open circuits in the paths between devices, many of them being bad solder joints between device pins and the board's conductive paths. To determine whether such a fault is indeed the cause of the observed fault effect, the tester proceeds, in accordance with the present invention, with a diagnostic sequence depicted in FIGS. 3A and 3B.

This routine modifies the test sequence. In the illustrated embodiment, the sequence is modified in such a manner as to simulate an open circuit in the conductor path between a given device input pin and its associated test node. If the device is of the transistor-transistor logic (TTL) type, for instance, failure to connect that pin to the board will cause the voltage at that pin to assume the high logic level. To simulate an open circuit, therefore, we apply a modified sequence, which is the same as the test sequence except that, in each vector, the component that corresponds to the input pin whose fault is being simulated is placed at the high logic level. If there actually is an open circuit at the input pin being tested for a fault, then the syndrome resulting from the modified sequence will be the same as that which resulted from the original test sequence. Reflection reveals that this result does not actually require that the modified sequence simulate an open circuit; the approach can work in principle with any modified sequence that is identical with the test sequence in all vector components but those associated with the pin in question. But the probability of error is acceptably low only if the test and modified sequences differ in a large number of the associated components, as they ordinarily are if the modified sequence simulates an open circuit at that pin.

Figure 3A:
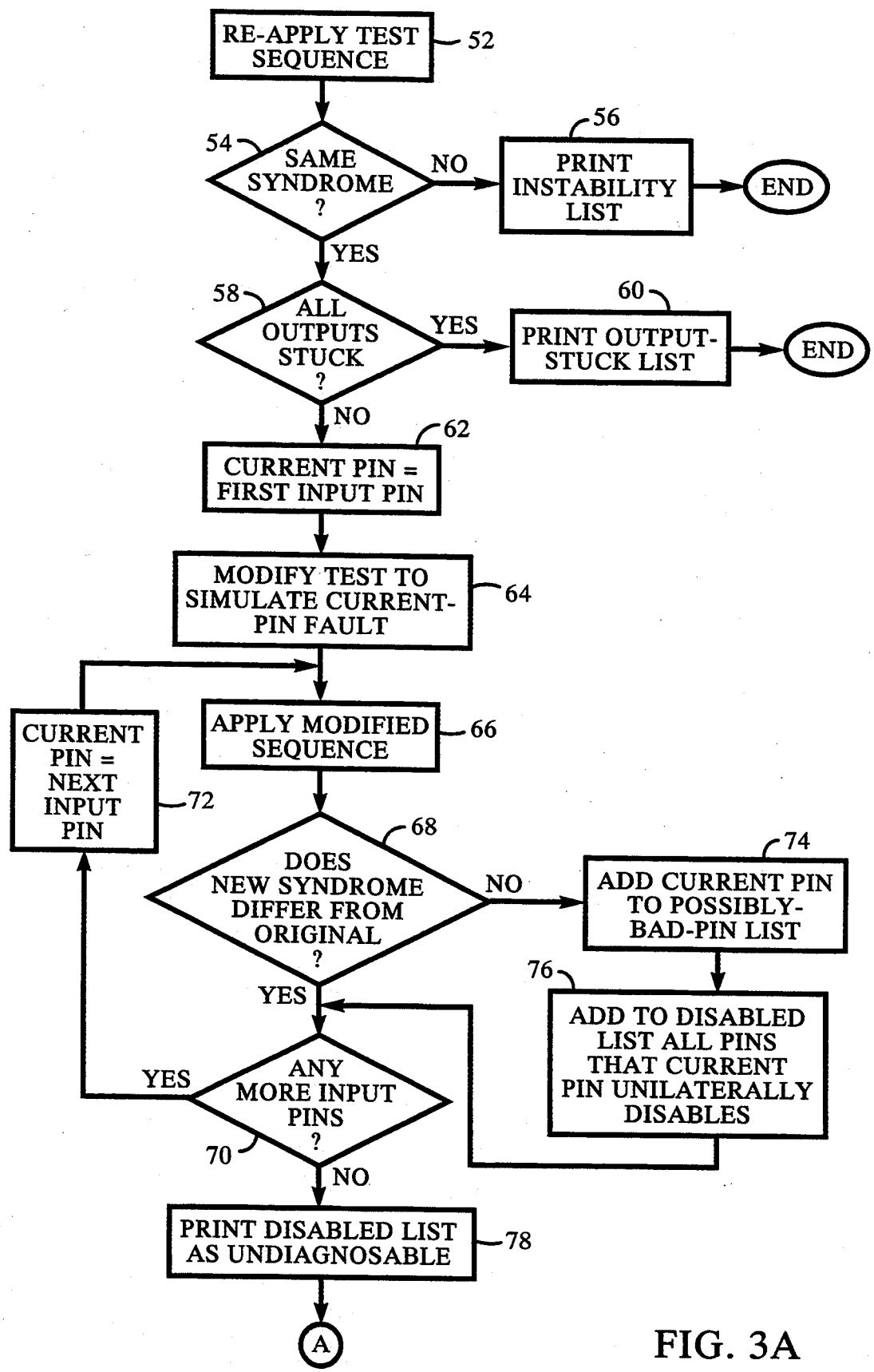
FIGS. 3A and 3B together constitute a flow chart depicting an embodiment of the present invention.
Figure 3B:
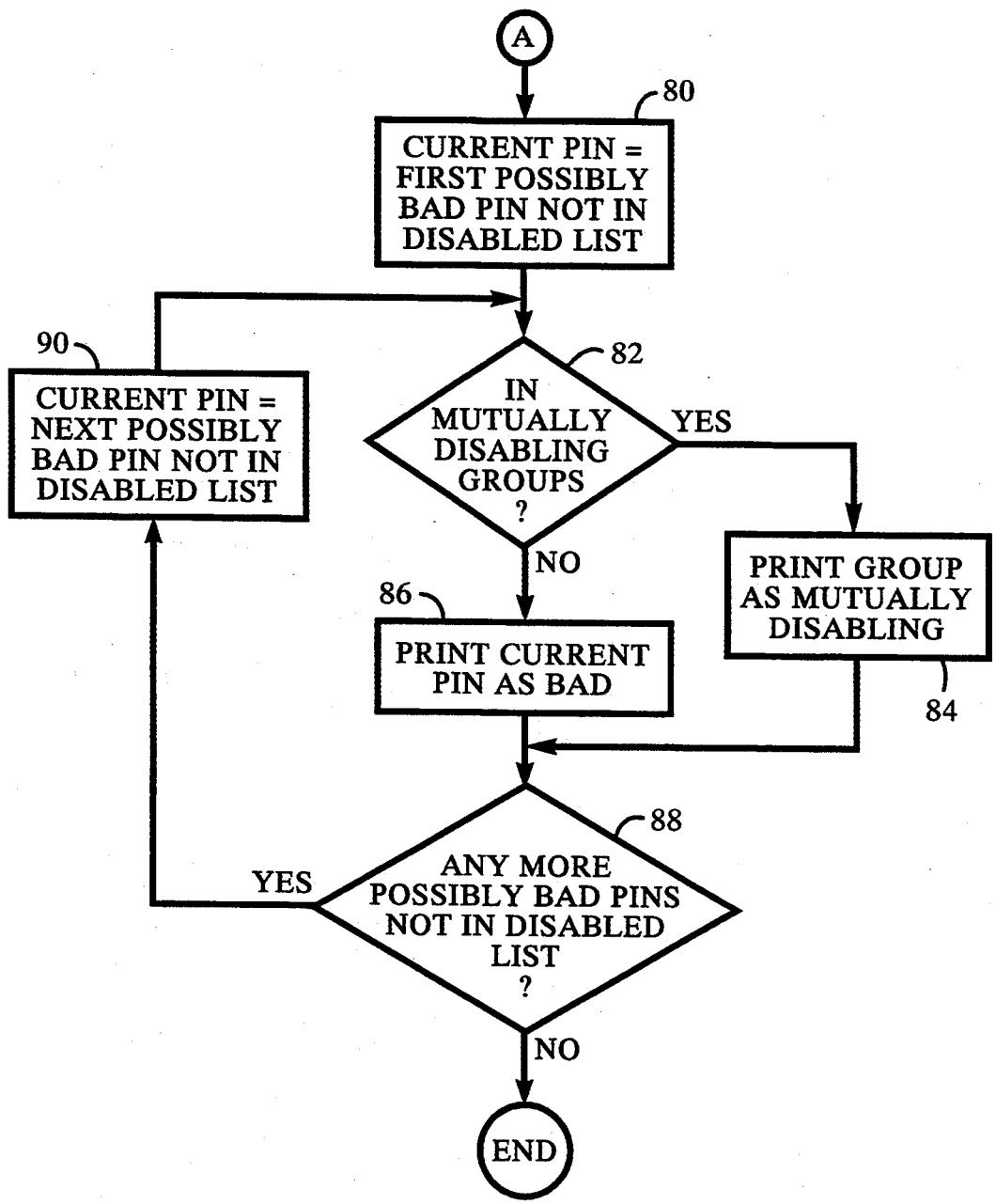

Although the routine of FIGS. 3A and 3B embodies this basic principle, it includes a number of embellishments that enable it to avoid the incorrect results that certain problems would otherwise cause. One such problem is what we will call "instability." Most board devices are finite-state machines: they have memory, and their outputs depend not only on their inputs but also on their states, i.e., on their memory contents. The ordinary in-circuit test therefore begins with an initialization vector sequence, which can take the device under test from an undetermined state to a known initial state from which the test is to start. For instance, many chips have reset pins that enable them to be set into a predetermined states by merely strobing the reset pins. Others may have boundary-scan facilities, by which a user may be able to place the chip in any of a number of states by serial application of a bit sequence that designates the intended state. In any event, proper operation of the fault-detection test requires the ability to initialize the chip.

Instability is what happens when a fault defeats this capability. For instance, a fault on the reset line causes instability if the test sequence relies on the reset facility for initialization purposes. In such a situation, applying the modified test for a given input pin would ordinarily result in a changed syndrome, and thus an indication that the given input pin is not at fault, even if the given input pin is disconnected.

To prevent such an erroneous result, the routine of FIGS. 3A and 3B begins with a step represented by block 52, in which it re-applies the original test sequence. It then compares the resultant syndrome with that which resulted from the test sequence's first application, as block 54 indicates, to determine whether they are the same.

We digress at this point to note that, although this and other vector-sequence comparisons can be straightforward vector-by-vector comparisons of the entire sequences, automatic circuit testers often save on storage capacity and comparison time by comparing data-compressed and/or -reduced versions of those sequences provided by apparatus such as those referred to as "cyclic redundancy check" (CRC) or "signature register" facilities. This expedient is sometimes employed in those situations in which the test sequence $\{T_n\}$ in some cases is a previously recorded sequence produced by sophisticated automatic-test-generation software that generates, from a software model of the device to be tested and a list of each type of fault that the test should detect, a sequence that will cause a fault effect to be propagated to a device output port if any of the listed faults is present. But it is particularly likely to be used in situations in which the input-node components of $\{T_n\}$ have not previously been recorded but are instead generated at run time by a pseudo-random-number generator that begins at a known state. In such cases, the "signature" of the output sequence is compared with the recorded signature of a known good device's response to an identical pseudo-random-number generator begun at the same known state. In any event, reference herein to vector-sequence comparisons are intended to include comparisons of data-compressed and/or -reduced versions of them.

If the result of this test repetition is not the same syndrome, the routine concludes that the fault is one that causes instability. Since the remainder of the routine relies on the ability to initialize the device, no further tests are performed. However, the routine does print (or otherwise provide) an indication of the instability and a list, fetched from a database whose generation is described below, of the pins at which faults are known to cause instability. Block 56 represents this step.

If the syndrome does repeat, however, the routine proceeds to deal with another situation that could result in erroneous diagnoses if not handled separately. Output-signal generation in certain types of chips is disabled unless an enabling logic level is present at an output-enabling input pin. Clearly, if the output pins of such a chip are disabled because the output-enable pin is disconnected, then all syndromes will be the same, regardless of how the applied vector sequence is modified, and blind application of the invention's basic approach would result in indications that faults are present at all input pins.

This situation is fairly easy to detect, however, because the output signals do not change: the output pins are "stuck" at certain signal levels and remain the same throughout the test. If comparison of the syndrome with the test vector's output components indicates that each syndrome component changes every time the corresponding test vector sequence changes, therefore, the routine of FIGS. 3A and 3B reports a "stuck" state and lists the set of input pins at which the database indicates that open circuits yield stuck output pins. Blocks 58 and 60 represent these steps.

If instability and stuck output pins have been ruled out, the routine proceeds to the heart of the method, entering a loop in which, for each input pin, it modifies the original test sequence to simulate an open circuit at that input pin, applies the modified sequence, and determines whether the resulting syndrome differs from the one that resulted from the original test sequence. Blocks 62, 64, 66, 68, 70, 72, 74, and 76 represent this loop.

If the observed syndrome does indeed differ from the original, then the signals applied to that input pin during the original test did have an effect, so that input pin must be properly connected. If the observed syndrome does not differ, on the other hand, the pin in question may be "bad"; i.e., an open circuit may exist between it and the test node by which it is intended to be driven. The current pin is therefore placed in a list of possibly bad pins, as block 74 indicates.

The pins in that list are only "possibly" bad, because the failure of the chip to respond to signals at the node in question may in fact be caused by a fault at another pin, which "disables" the first pin, i.e., causes the device to be unaffected by the inputs at the first pin. For instance, an open circuit at one input pin of a NAND gate that causes that pin to remain at a logic-zero level will prevent that gate from responding to signals applied to the other input pin's test node, even though that other input pin is properly connected. The routine therefore determines in later steps whether any of the pins diagnosed as possibly bad is among those that could have been disabled by any of the other pins similarly diagnosed. To this end, the routine performs a step represented by block 76, in which it consults the database to determine which pins have been identified as being those that will be (in the illustrated embodiment, "unilaterally") disabled by a fault at the current pin, and it adds these pins to a list of disabled pins. (As will be explained presently, the addition of one NAND-gate input pin to the possibly-bad-pin list in block 74 does not result in the other input pin's being placed in the disabled list, because the disabling in the case of NAND-gate inputs is mutual, not unilateral.)

When modified tests have been run for all of the input pins, a report is generated, as block 78 indicates, that identifies the pins in the disabled list as undiagnosable: if some other fault has disabled those pins, there is no way of telling, with only the normal bed-of-nails probing, whether those pins are properly connected.

As was mentioned above, addition of one NAND-gate input to the possibly-bad-pin list in step 74 does not result in additional of that NAND gate's other input pin to the disabled list in block 76. The reason for this is that any further diagnostic efforts are facilitated by having groups of mutually disabling pins reported separately from unilaterally disabled pins. Accordingly, any group of mutually disabling pins to which a given pin belongs is listed in the database separately from the pins that the given pin disables unilaterally, as will be described below. The routine can therefore check the database entries of all possibly bad pins not identified as being disabled to determine whether they belong to respective groups of mutually disabling pins. If a possibly bad pin belongs to no such group and is not in the disabled list, it is pronounced actually bad, and the routine so reports it. If a pin does belong to such a group, however, the report lists that group as being one in which an unidentified member is bad. Blocks 80, 82, 84, 86, 88, and 90 represent these steps.

Although it can be seen that there are a number of situations in which the illustrated method cannot identify the specific pin at which a fault occurs, it will also be appreciated that the method specifically identifies faulty pins in many other situations, including many in which multiple faults occur simultaneously. Therefore, the method greatly facilitates diagnosis of some of the most commonly occurring printed-circuit-board faults.

Figure 4A:
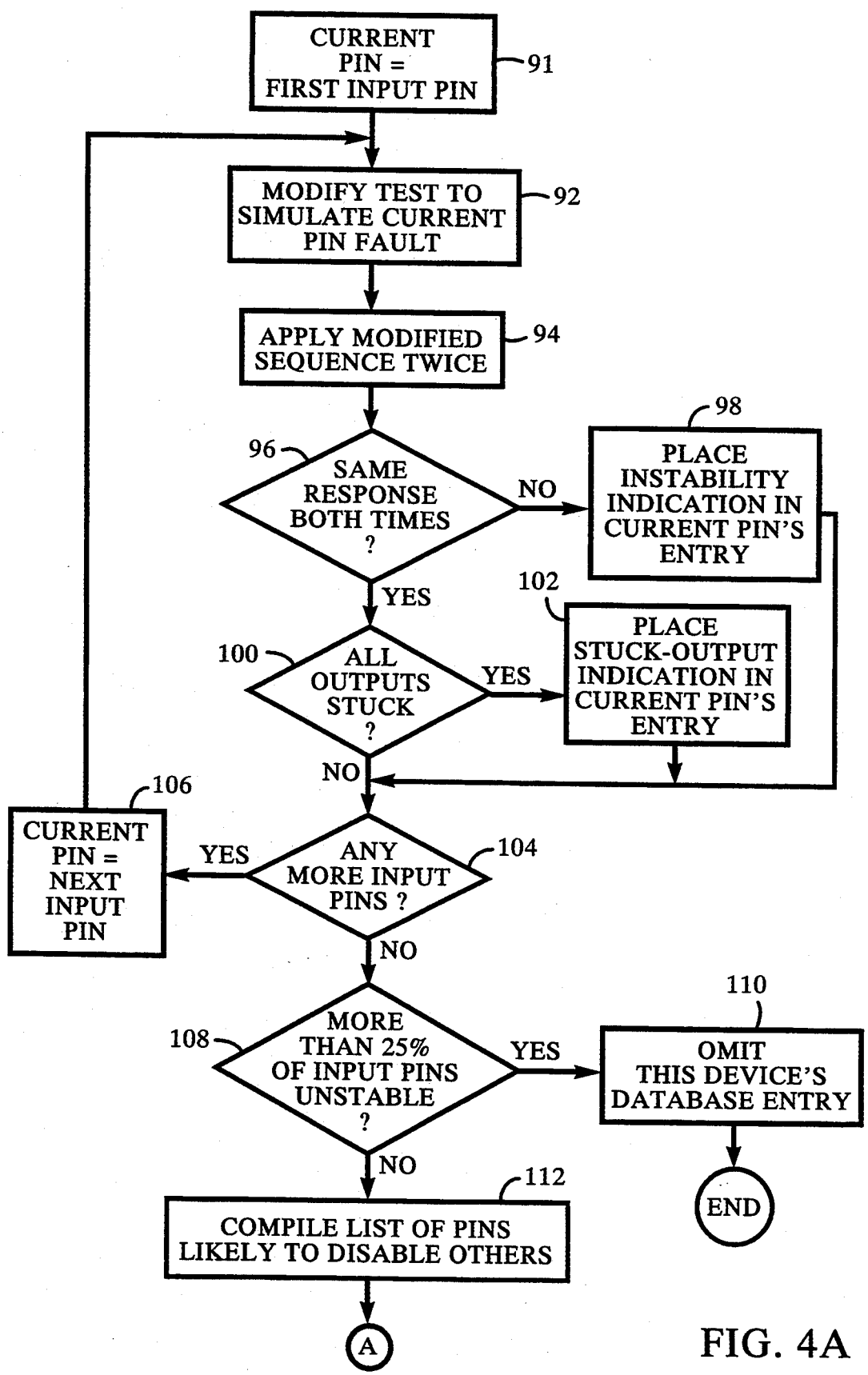
FIGS. 4A and 4B together constitute a flow chart of a routine for creating a database employed in the method of FIG. 3.

Having described the test routine itself, we now turn to generation of the database that it consults. As can be inferred from the preceding discussion, the database lists for each input pin (1) whether a fault at that pin will cause instability, (2) whether a fault at that pin will disable the device's output pins, (3) the other input pins that a fault at the input pin in question will disable, and (4) the members of any group of mutually disabling input pins to which the pin in question belongs. For an in-circuit test of board devices of a given type, the database-producing tool begins with one input pin of that device type, as block 91 of FIG. 4A indicates, and first determines whether a fault at that input pin will cause instability. Existing simulation programs can simulate an integrated circuit's operation and thereby determine its response to given stimuli such as the intended test vector sequence. Such a tool can be used in this database-generation routine to determine whether an open circuit at the input pin in question will cause instability. Alternatively, one might simply detect instabilities by applying the test vector sequence to an actual board in which the input pin in question is cut so as to introduce such a fault. Other approaches are possible, too.

In the illustrated embodiment, however, we adapt an existing technique, called "hardware fault insertion," which has conventionally been used to qualify test vector sequences that have been generated by various sources. Specifically, we modify the test vector sequence to simulate an open circuit at the current input pin, in the manner described above in connection with the diagnostic routine, and apply the modified vector sequence twice to a good specimen of that type of device, as blocks 92 and 94 indicate. If the same syndrome does not result both times, then a database entry is made for that input pin, as blocks 96 and 98 indicate, to identify the current pin as being among those that can cause instability if open circuits occur at them.

The routine next determines whether a fault in the current input pin causes all output pins to be stuck, as block 100 indicates. It does this by comparing the syndrome with the modified vector sequence. If the outputs are stuck, an indication of this fact is placed in the entry for the current input pin, as block 102 indicates. This process is repeated for all input pins, as blocks 104 and 106 indicate.

Figure 4B:
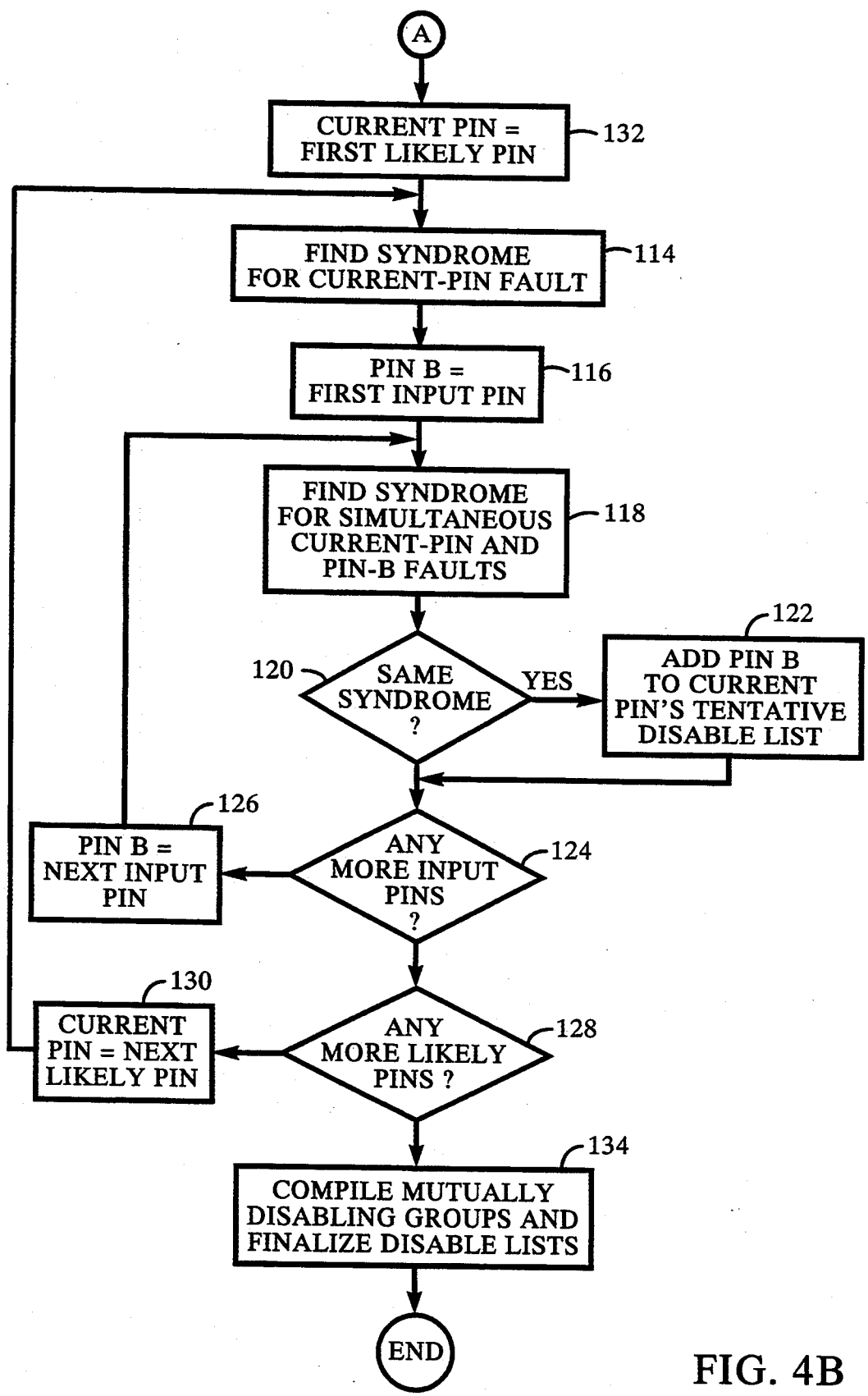

There are certain chips whose faults we do not consider worth diagnosing. Specifically, we do not consider it worthwhile even to perform the test-sequence reapplication represented by block 52 of FIG. 3A if a fault at any one of more than 25% of a chip's input pins will cause instability. Accordingly, if the particular database-generation routine illustrated in FIGS. 4A and 4B identifies more than that many input pins as causing instability when they have faults, it does not compile database entries for that chip. Blocks 108 and 110 represent this aspect of the illustrated database-generation routine. Production testing of chips for which there is no such database entry does not proceed from the fault-detection phase to the diagnostic phase described in FIGS. 3A and 3B.

The next part of the routine determines whether various pins can disable others. If all pins were checked for this possibility, this aspect of the routine could be somewhat time-consuming, so we restrict our consideration to only those pins for which this possibility appears likely. This possibility appears likely, for instance, for pins that belong to a group of pins in which each pin has an identical syndrome. In a step represented by block 112, therefore, we include such pins in a list of pins likely to disable others. We also include in that list pins whose syndrome is particularly "bad."

Specifically, we assign to each input pin a metric that indicates how different the nominal response is from the response that results from a fault at that pin. A metric that is convenient for this purpose is simply the sum of the anomaly-indicating components, i.e., of the logic-one values in FIG. 2, in all of that fault's syndrome vectors. In some circles such a metric would be referred to as "Hamming distance" between the nominal and actual responses. We have observed that the distances for most of the pins tend to cluster in a lower portion of the distance range, while smaller clusters occur in upper parts of the range. The distances for pins that disable other pins occur in these upper clusters, their values typically exceeding twice the median distance. In a step represented by block 112, therefore, we compile a list of pins whose distances exceed twice the median distance, and we compile respective disable lists for only those pins.

To determine a given likely pin's disable list, we find the syndrome for an open circuit at that pin, as block 114 indicates. For a given second pin ("pin B" in FIG. 4A), we then find the syndrome for simultaneous open circuits on the current pin and that other pin, as blocks 116 and 118 indicate. If the syndrome for a fault on the current pin is the same as that for simultaneous faults on that pin and the other pin, then the other pin is added to a tentative disable list for the current pin, as blocks 120 and 122 indicate. For a given pin, respective simultaneous-fault syndromes are inspected for all other input pins, as blocks 124 and 126 indicate, and this whole procedure is performed for all likely pins, as blocks 128, 130, and 132 indicate.

The result is a tentative disable list for each of the pins in the likely list. Each pin's tentative list is inspected, and if a pin in a given pin's tentative list has the given pin in its own tentative list, that pin is removed from the tentative list and entered in a mutually-disabling list for the given pin. That is, the tentative lists are culled so that the list that remains for a given pin contains only those pins that the given pin unilaterally disables; other pins are entered in its group of mutually disabling pins, for reasons described above. Block 134 represents this step. When the segregation, represented by block 134, between unilateral and mutually disabling has been done, the database generation is complete, and the database is ready to be employed in the diagnostic procedure of FIGS. 3A and 3B.

It is apparent that the teachings of the present invention enable one to diagnose simultaneous open-circuit faults automatically with only the normal, bed-of-nails probing and without the massive simulation effort and data-storage burden that would be required to achieve the same result by way of a fault-dictionary approach. The present invention thus constitutes a significant advance in the art.

We claim:

1. For diagnosing improper connections between a board device of a given type, which board device includes device input and output pins, and a printed-circuit board, on which the board device is mounted, that includes board nodes associated with respective device input and output pins and further includes conductive paths intended to place each device input pin in electrical communication with each board node associated therewith, a method comprising the steps of:
   A) compiling for at least one, given device input pin of the given type of board device a unilaterally-disabling list of device input pins, at which an open circuit does not disable the given device input pin, that are disabled by an open circuit at the given device input pin;
   B) applying to a plurality of the board nodes associated with device input pins respective components, associated with those device input pins, of a test vector sequence of signal vectors;
   C) sensing at predetermined nodes a first response to the test vector sequence;
   D) applying to the plurality of the board nodes associated with device input pins respective components of a modified vector sequence that is the same as the test vector sequence except that the values of at least some of the modified vector sequence's components applied to the board node associated with the given device input pin differ from the corresponding components in the test vector sequence;
   E) sensing at the predetermined nodes a response to the modified vector sequence;
   F) compiling a possibly-open list of possibly open device input pins that includes the given device input pin if the response to the modified vector sequence does not differ from the response to the test vector sequence; and
   G) generating an opens-test report containing an undiagnosable list of every pin that is in any unilaterally-disabling list compiled for a pin in the possibly-open list.

2. For diagnosing improper connections between a board device of a given type, which board device includes device input and output pins, and a printed-circuit board, on which the board device is mounted, that includes board nodes associated with respective input and output pins and further includes conductive paths intended to place each device input pin in electrical communication with each board node associated therewith, a method comprising the steps of:
   A) applying to a plurality of the board nodes associated with device input pins respective components, associated with those device input pins, of a test vector sequence of signal vectors;
   B) sensing at predetermined nodes a response to the test vector sequence;
   C) for a given device input pin, applying to the plurality of the board nodes associated with device input pins respective components of a modified vector sequence that is the same as the test vector sequence except that at least some of the modified vector sequence's components applied to the board node associated with the given device input pin differ from the corresponding components in the test vector sequence;
   D) sensing at predetermined nodes the response to the modified vector sequence;
   E) compiling a possibly-open list of possibly open input pins that includes the given device input pin if the response to the modified vector sequence does not differ from the response to the test vector sequence;
   F) compiling a pin mutually disabling group consisting of the given device input pin and every device input pin:
      i) at which, if an open circuit occurs, that open circuit disables the given device input pin, and
      ii) that is disabled when an open circuit occurs at the given device input pin; and
   G) generating an opens-test report containing a list of every mutually disabling group that includes a pin in the possibly-open list.

3. For diagnosing improper connections between a board device of a given type, which device includes device input and output pins, and a printed-circuit board, on which the board device is mounted, that includes board nodes associated with respective device input and output pins and further includes conductive paths intended to place each input pin in electrical communication with each board node associated therewith, a method comprising the steps of:
   A) compiling an instability list of input pins at which if an open circuit occurs it causes instability in the given type of board device;
   B) applying to a plurality of the board nodes associated with device input pins respective components, associated with those device input pins, of a test vector sequence of signal vectors;
   C) sensing at predetermined nodes a first response to the test vector sequence;
   D) performing a second application of the test vector sequence;
   E) sensing, in response to the second application of the test vector sequence, a second response;

F) determining whether the second response is identical to the first response; and G) generating an opens-test report including the instability list if the first and second responses to the test vector sequences differ.

4. A method as defined in claim 3 wherein the method further comprises the steps of:

A) compiling a stuck list of input pins of the given type of board device at which if an open circuit occurs, that open circuit prevents changes in the given type of board device's outputs;

B) determining whether the first response includes changes at any of the predetermined nodes; and C) generating a stuck report including the stuck list of input pins if the first response includes no changes at any of the predetermined nodes.

5. For diagnosing improper connections between a board device of a given type, which board device includes device input and output pins, and a printed-circuit board, on which the board device is mounted, that includes board nodes associated with respective device input and output pins and further includes conductive paths intended to place each device input pin in electrical communication with each board node associated therewith, a method comprising the steps of:

A) compiling, for at least a given device input pin of the given type of board device, a pin disabling list of device input pins that are disabled when an open circuit occurs at the given device input pin;

B) applying to a plurality of the board nodes associated with device input pins respective components, associated with those device input pins, of a test vector sequence of signal vectors;

C) sensing at predetermined nodes a response to the test vector sequence;

D) for a given device input pin, applying to the plurality of the board nodes associated with device input pins respective components of a modified vector sequence that is the same as the test vector sequence except that the values of at least some of the modified vector sequence's components applied to the node associated with the given device input pin differ from the corresponding components in the test vector sequence;

E) sensing at predetermined nodes the response to the modified vector sequence;

F) compiling a possibly-open list of possibly open input pins that includes the given device input pin if the response to the modified vector sequence does not differ from the response to the test vector sequence;

G) generating an opens-test report containing an open-pin list that consists of pins in the possibly-open list that are not in a pin disabling list compiled for a pin in the possibly-open list.

6. A method as defined in claim 5 wherein the values of the modified vector sequence's components applied to the board node associated with the given device input pin are those that would result at the given device input pin if the given device input pin were disconnected from its associated board node.

7. A method as defined in claim 5 wherein:

A) the step of compiling a pin disabling list for the given device input pin comprises compiling a unilaterally-disabling list of input pins:

i) at which, if an open circuit occurs, the open circuit does not disable the given device input pin and ii) that are disabled if an open circuit occurs at the given device input pin; and B) the opens-test report includes an undiagnosable list of every device input pin that is in any unilaterally-disabling list compiled for a device input pin in the possibly-open list.

8. A method as defined in claim 5 wherein:

A) the step of compiling a pin disabling list for a given device input pin comprises compiling a pin mutually disabling group consisting of the given device input pin and every device input pin in the pin disabling list compiled therefor at which, if an open circuit occurs, that open circuit disables the given device input pin; and B) the opens-test report includes a list of every mutually disabling group that includes a device input pin in the possibly-open list.

9. A method as defined in claim 8 wherein:

A) the step of compiling a pin disabling list for a given pin comprises compiling a unilaterally-disabling list of input pins:

i) at which an open circuit does not disable the given device input pin and ii) that are disabled by an open circuit at the given device input pin; and B) the opens-test report includes an undiagnosable list of every pin that is in any unilaterally-disabling list compiled for a pin in the possibly-open list.

* * * * *